United States Patent
Li et al.

(10) Patent No.: US 8,283,939 B2
(45) Date of Patent: Oct. 9, 2012

(54) TEST PROBE

(75) Inventors: Shen-Chun Li, Taipei Hsien (TW);
Shou-Kuo Hsu, Taipei Hsien (TW)

(73) Assignee: Hon Hai Precision Industry Co., Ltd.,
Tu-Cheng, New Taipei (TW)

( * ) Notice: Subject to any disclaimer, the term of this patent is extended or adjusted under 35 U.S.C. 154(b) by 280 days.

(21) Appl. No.: 12/752,138

(22) Filed: Apr. 1, 2010

(65) Prior Publication Data
US 2011/0050261 A1    Mar. 3, 2011

(51) Int. Cl.
*G01R 31/20* (2006.01)
(52) U.S. Cl. ............ 324/754.01; 324/437; 324/446; 324/755.01
(58) Field of Classification Search .......... 324/754.01, 324/754.03, 755.01, 149, 729, 446, 445, 324/437, 696
See application file for complete search history.

(56) References Cited

U.S. PATENT DOCUMENTS

| | | | | |
|---|---|---|---|---|
| 3,893,027 A | * | 7/1975 | Veenendaal | 324/72.5 |
| 4,764,722 A | * | 8/1988 | Coughlin et al. | 324/755.02 |
| 5,136,237 A | * | 8/1992 | Smith et al. | 324/149 |
| 5,235,268 A | * | 8/1993 | Harthcock | 324/115 |
| 6,466,000 B1 | * | 10/2002 | Nightingale | 324/72.5 |
| 6,700,397 B2 | * | 3/2004 | Hollman et al. | 324/756.01 |
| 7,091,735 B2 | * | 8/2006 | Lee et al. | 324/755.05 |
| 2003/0224641 A1 | * | 12/2003 | Kimbley | 439/219 |

FOREIGN PATENT DOCUMENTS
EP        2180326 A1 *  4/2010
* cited by examiner

*Primary Examiner* — Huy Q Phan
*Assistant Examiner* — Thang Le
(74) *Attorney, Agent, or Firm* — Altis Law Group, Inc.

(57) ABSTRACT

A test probe includes a filtering unit and a contact unit. The filtering unit includes an inductive component, a capacitive component, and an insulation component insulates the inductive component from the capacitive component. The contact unit contacts a test point to get a test signal. The filtering unit filters noise from the test signal. The test probe can be assembled and disassembled easily, and parameters of the filtering unit can be changed by changing structure of each component.

11 Claims, 5 Drawing Sheets

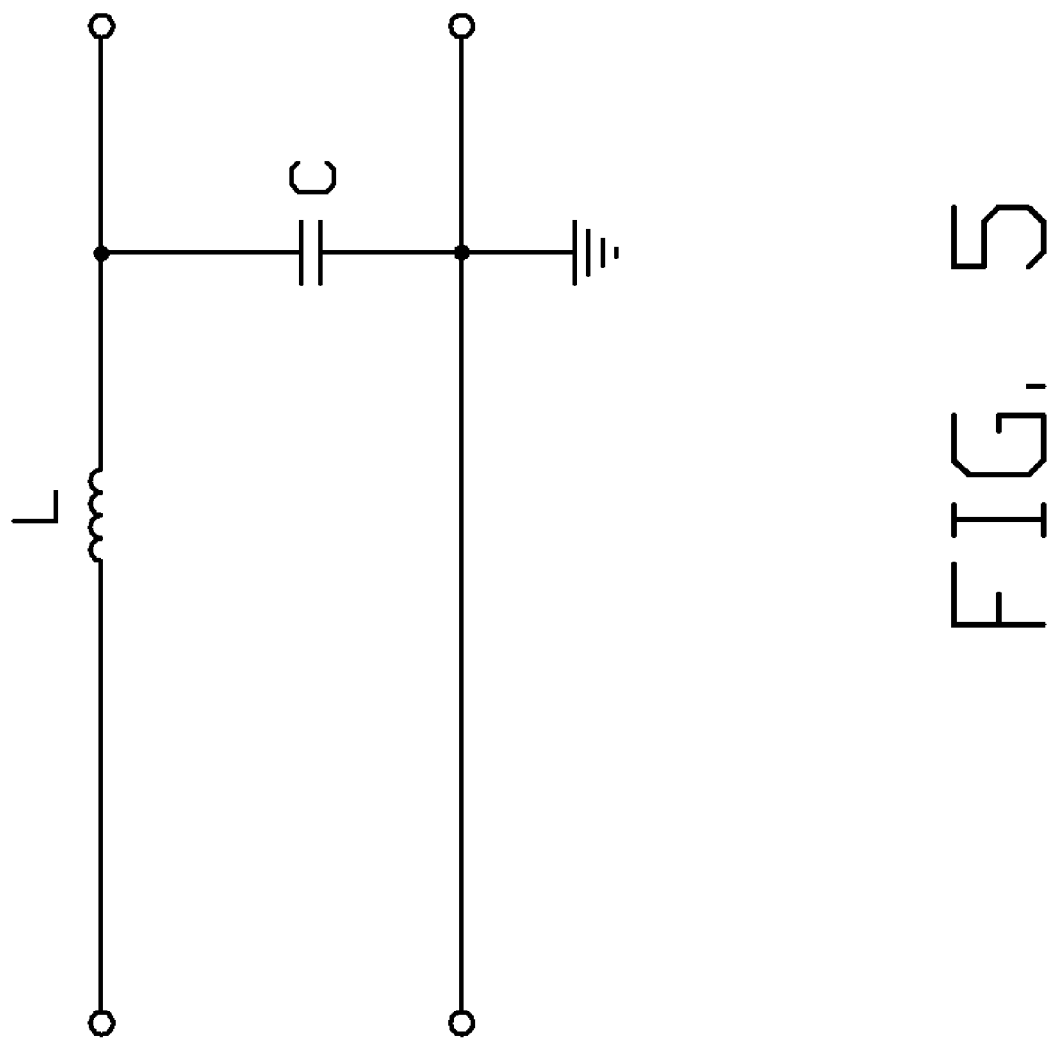

TEST PROBE

BACKGROUND

1. Technical Field

The present disclosure relates to test probes, and particularly to a test probe having a filtering function.

2. Description of Related Art

Probes are vital to some test devices, such as oscilloscopes, to obtain signals from test points of devices being tested, such as circuit boards. However, when a probe contacts a test point of a circuit board to obtain a test signal, noise generated by other electrical components mounted on the circuit board, or carried by the test signal, will be transmitted to the test device via the probe. Therefore, test results can be affected by the noise.

BRIEF DESCRIPTION OF THE DRAWINGS

FIG. 5 is an equivalent circuit diagram of the filtering unit of FIG. 1.

DETAILED DESCRIPTION

Figure 1:
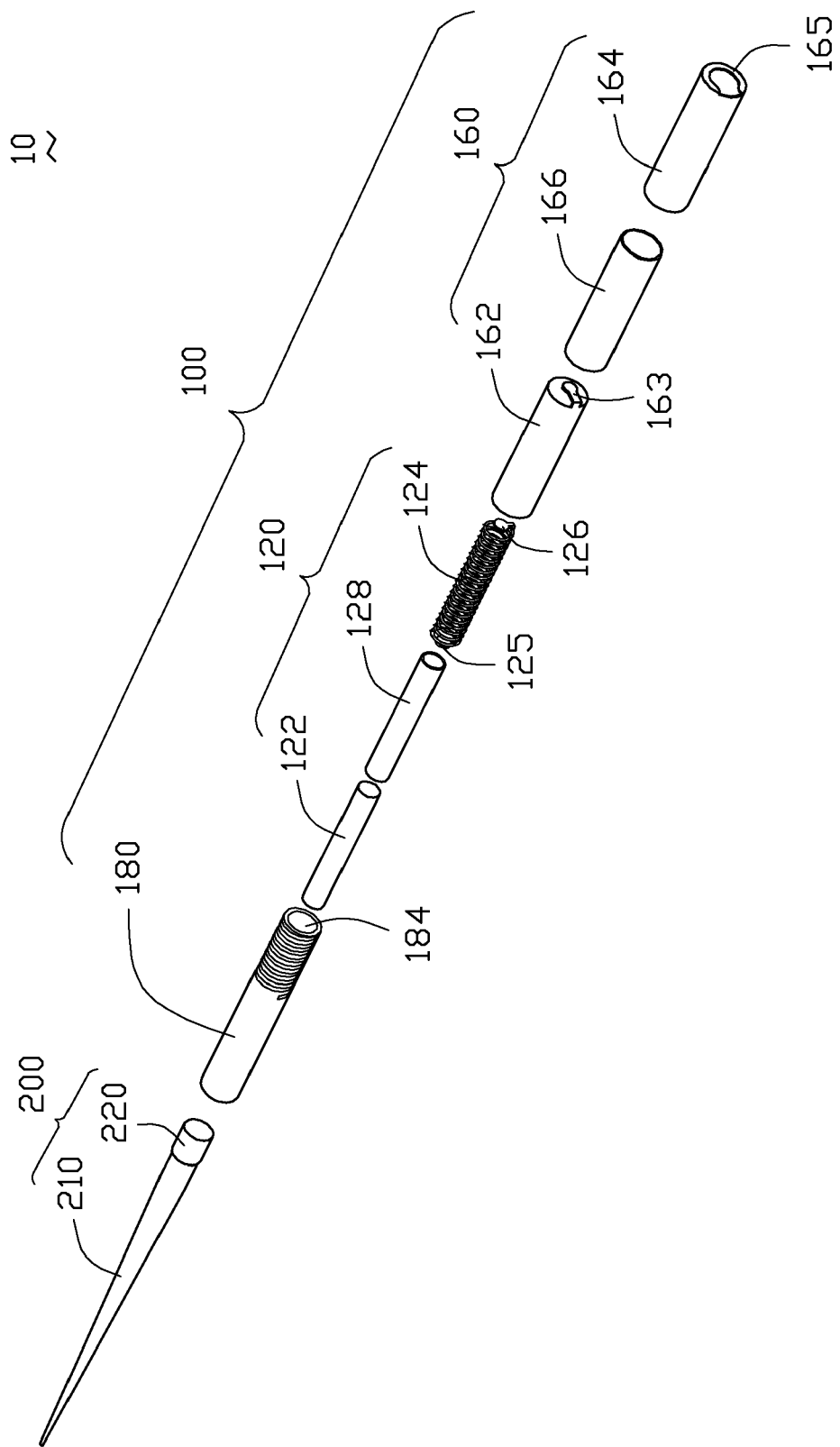
FIG. 1 is an exploded, isometric view of an embodiment of a test probe, the test probe includes a filtering unit, and the filtering unit includes an insulation component.
Figure 2:
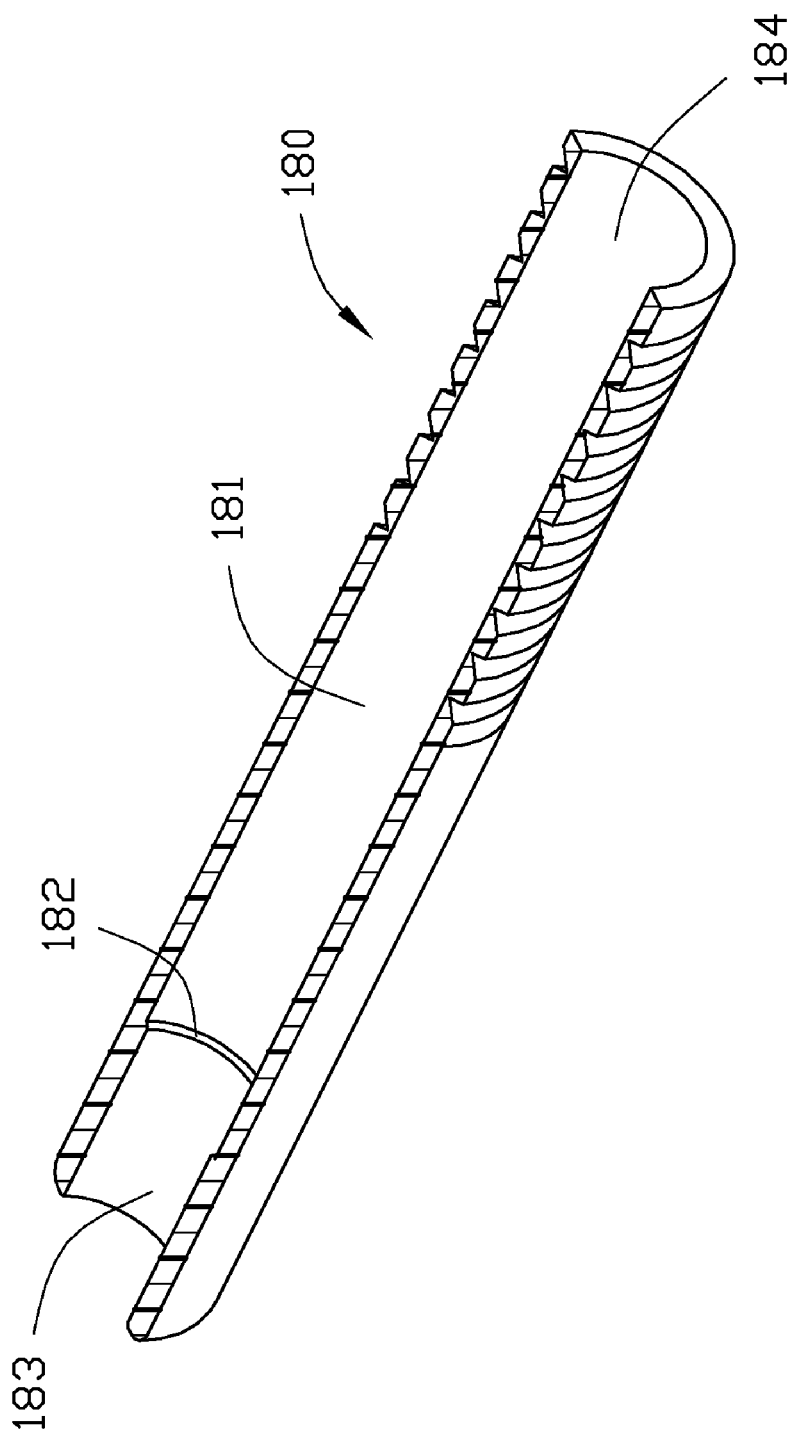
FIG. 2 is a cutaway, isometric view of the insulation component of FIG. 1.

Referring to FIGS. 1 and 2, an embodiment of a test probe 10 includes a filtering unit 100 and a contact unit 200. The filtering unit 100 includes an inductive component 120, a capacitive component 160, and an insulation component 180. The contact unit 200 includes a retaining portion 220 and a tip portion 210 extending from the retaining portion 220. The contact unit 200 is used to contact a test point of a device undergoing testing (not shown), such as a circuit board, to get a test signal. The filtering unit 100 filters noise from the test signal.

The inductive component 120 includes a magnetic cylinder 122, an elastic helical conductive coil 124, an insulation tube 128, and two contacting tabs 125 and 126 extending from opposite ends of the conductive coil 124 and aligning with an axis of the conductive coil 124. The magnetic cylinder 122 may be interferentially received in the insulation tube 128, and the conductive coil 124 may fit around the insulation tube 128. In one embodiment, the magnetic cylinder 122 may be made of magnetizable material, such as iron, cobalt, nickel etc.

The capacitive component 160 includes a metal inner tube 162, a contacting tab 163, a metal outer tube 164, a stop portion 165, and an insulation tube 166. The metal inner tube 162 may be received in the insulation tube 166, and the insulation tube 166 may be received in the metal outer tube 164. The contacting tab 163 extends from a circumference of an end of the metal inner tube 162, to align with an axis of the metal inner tube 162. The stop portion 165 is C-shaped and extends from one end of the metal outer tube 164 around the axis of the outer tube 164. In one embodiment, an inner surface of the metal inner tube 162 is threaded, and the insulation tube 166 has sticky inner and outer surfaces such as might be accomplished with layers of adhesive.

The insulation component 180 axially defines a through hole 181, with two openings 183 and 184 defined in opposite ends of the insulation component 180. A circular-shaped restricting portion 182 extends towards the through hole 181 from a sidewall bounding the through hole 181, at the opening 183. A radius of the through hole 181 of the insulation component 180 is greater than a radius of the conductive coil 124. A length of the insulation component 180 is greater than a length of the inductive component 120. The insulation component 180 is externally threaded in an area near the opening 184, and can be screwed into the metal inner tube 162. The insulation component 180 and the insulation tubes 128 and 166 may be made of resin reinforced oxide glass fiber. In other embodiments, the insulation tube 128 may be replaced with an insulation layer covering a circumference of the magnetic cylinder 122, and the insulation tube 166 may be replaced with an insulation layer covering a circumference of the metal inner tube 162.

The contact unit 200 may be inserted into the through hole 181 from the opening 184, and received in the insulation component 180 with a part of the tip portion 210 outside the insulation component 180 from the opening 184. A greatest radius of the tip portion 210 is less than an inner radius of the restricting portion 182, to enable the tip portion 210 to pass through the restricting portion 182 smoothly. A radius of the retaining portion 220 is greater than the inner radius of the restricting portion 182, to ensure the retaining portion 220 not to disengage from the insulation component 180 under a pressing force of the conductive coil 124, which is resiliently deformed. In one embodiment, the tip portion 210 is tapered, tapering from the retaining portion towards a distal end of the tip portion 210.

Figure 3:
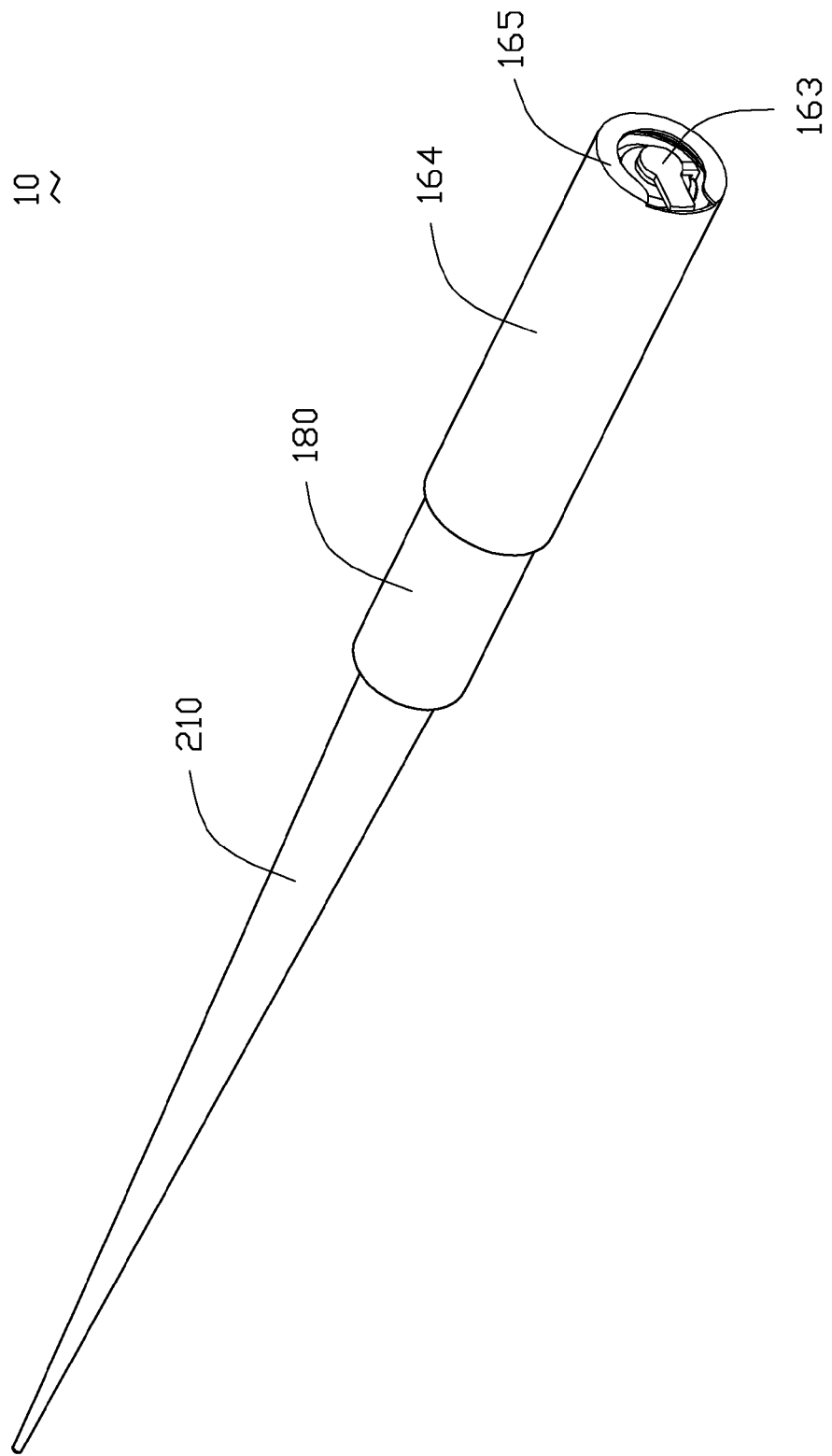
FIG. 3 is an assembled view of the test probe of FIG. 1.
Figure 4:
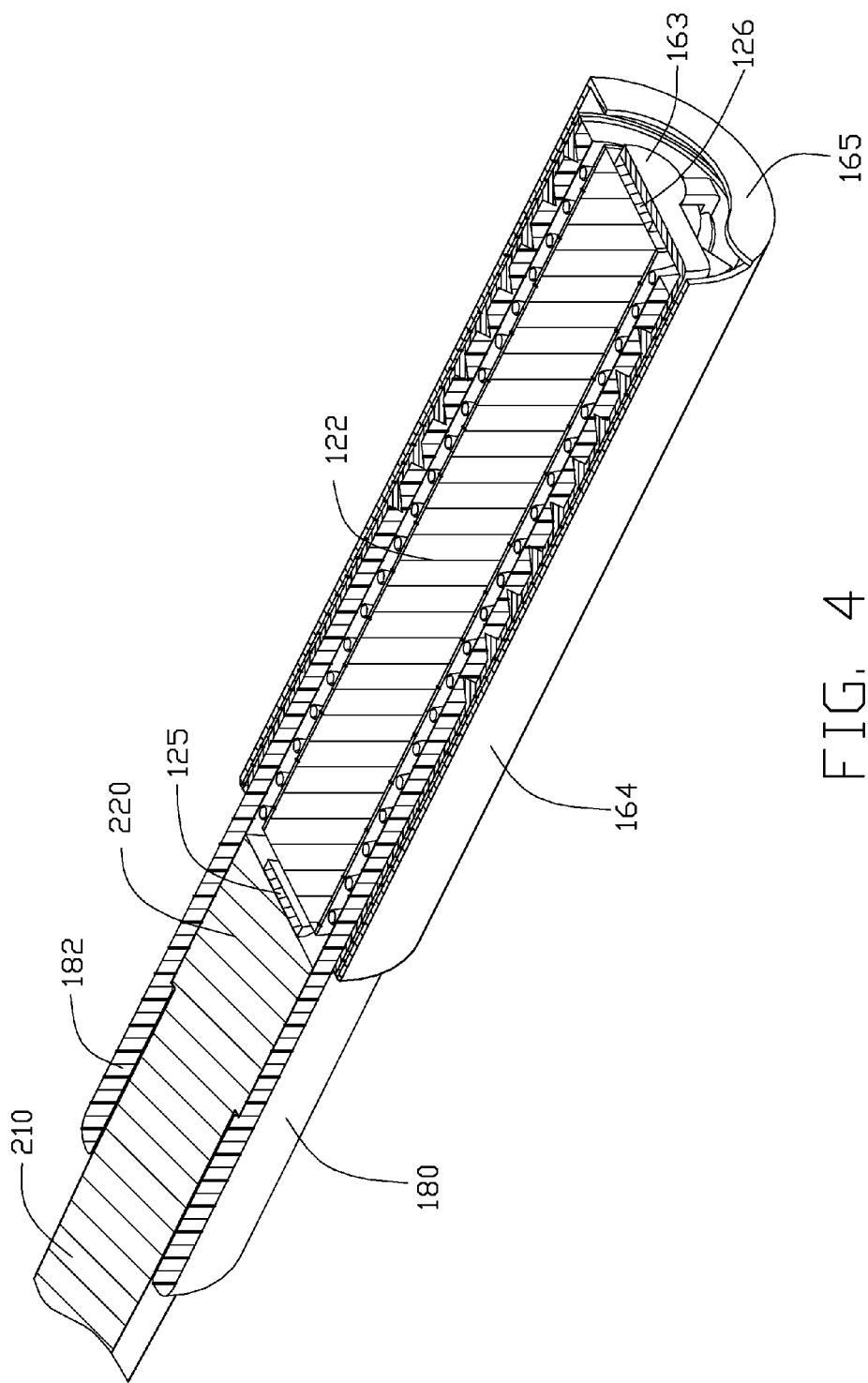
FIG. 4 is a cutaway, isometric view of the test probe of FIG. 3.

Referring to FIGS. 3 and 4, in assembly, the magnetic cylinder 122 is interferentially received in the insulation tube 128, the conductive coil 124 fits about the insulation tube 128. The insulation tube 166 fits about the metal inner tube 162, the metal outer tube 164 fits about the insulation tube 166, and the insulation tube 166 holds the metal inner tube 162 and the metal outer tube 164 together with its stickiness and insulates the metal inner tube 162 from the metal outer tube 164. The contact unit 200 and the inductive component 120 are inserted into the through hole 181 through the opening 184 in sequence, then the contact unit 200 and the inductive component 120 are received in the insulation component 180 with the tip portion 210 outside the insulation component 180. The insulation component 180 is rotated in a first direction to screw it to the capacitive component 160.

After the test probe 10 is assembled, the insulation component 180 is sandwiched between the inductive component 120 and the capacitive component 160, to insulate the inductive component 120 from the capacitive component 160. The retaining portion 220 contacts the contacting tab 125 of the conductive coil 124, such that the contact unit 200 electrically connects to the inductive component 120, and the retaining portion 220 abuts against the restricting portion 182 under a pressing force of the resiliently deformed conductive coil 124. The contacting tab 126 of the conductive coil 124 contacts the contacting tab 163 of the metal inner tube 162, such that the inductive component 120 is electrically connected to the capacitive component 160 in series, and the contact unit 200 is electrically connected to the capacitive component 160 via the inductive component 120. The contacting tab 125 functions as an input terminal of the filtering unit 100, the contacting tab 163 functions as an output terminal of the filtering unit 100, and the stop portion 165 prevents the insulation tube 166 and the insulation component 180 from disengaging from the probe 10.

Referring to FIG. 5, an equivalent circuit of the filtering unit 100 includes an inductor L and a capacitor C. Where, the inductive component 120 and the capacitive component 160 of the filtering unit 100 are equivalent to the inductor L and the capacitor C, which are connected in series. The metal inner tube 162 and the metal outer tube 164 of the capacitive component 160 are equivalent to first and second terminals of the capacitor C respectively. The second terminal of the capacitor C is grounded. Therefore, the filtering unit 100 functions as a low pass filter.

In use, when a test device, such as an oscilloscope, uses the test probe 10 to get the test signal from the test point of the device undergoing testing, the tip portion 210 contacts the test point and the test signal is transmitted to the filtering unit 100 via the contact unit 200. Noise generated by other electrical components mounted on the under test device or carried by the test signal itself are filtered by the filtering unit 100 and the test signal is transmitted to the test device. Therefore, the test device can test signals without noise to get a more accurate test result. Furthermore, when putting the tip portion 210 to the test point with a pressure larger than normal, the conductive coil 124 will deform to enable the tip portion 210 to withdraw back into the through hole 181, therefore, damage caused by excessive pressure can be avoided.

Parameters of the filtering unit 100 can be changed by changing structure of each component of the filtering unit 100 to meet different needs. For example, material of each component, radiuses of the magnetic cylinders 122, density of the conductive coil 124, thickness of the dielectric tubes 128 and 166, and thickness of the insulation component 180, can be changed according to actual need. When any component needs to be replaced, rotating the insulation component 180 in a second direction opposite to the first direction to withdraw the insulation component 180 from the metal inner tube 162, such that the filtering unit 100 is detached.

As detailed above, according to employing the inductive component 120 and the capacitive component 160, the test probe 10 has filtering function. With simple structure, the test probe 10 can be assembled and disassembled easily, and can be reassembled to meet different filtering needs. The test probe 10 also can avoid damage caused by excess pressure, since the conductive coil 124 is elastic.

It is to be understood, however, that even though numerous characteristics and advantages of the embodiments have been set forth in the foregoing description, together with details of the structure and function of the embodiments, the disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. A test probe comprising:
    a filtering unit comprising:
        an insulation component axially defining a through hole, with a restricting portion arranged in the through hole;
        an inductance component received in the through hole, the inductance component comprising a magnetic cylinder, a conductive coil insulated from and fitting around the magnetic cylinder, and a first and a second contacting tabs extending from opposite ends of the conductive coil; and
        a capacitance component comprising a metal inner tube fitting around the insulation component, a metal outer tube insulated from and fitting around the metal inner tube, and a third contacting tab extending from an end of the metal inner tube to contact the first contacting tab; and
    a contact unit comprising a retaining portion received in the through hole, abutting against the restricting portion and contacting the second contacting tab, and a tip portion extending from the retaining portion and passing through the restricting portion.

2. The test probe of claim 1, wherein the magnetic cylinder is made of magnetizable material.

3. The test probe of claim 1, wherein the magnetic cylinder is insulated from the conductive coil by a first insulation tube, the metal inner tube is insulated from the metal outer tube by a second insulation tube.

4. The test probe of claim 3, wherein the first and second insulation tubes and the insulation component are made of resin reinforced oxide glass fiber.

5. The test probe of claim 1, wherein the first and second contacting tabs radially extend from each circumference of the opposite ends of the conductive coil.

6. The test probe of claim 1, wherein the third contacting tab radially extends from a circumference of the end of the metal inner tube.

7. The test probe of claim 1, wherein the capacitance component further comprises a stop portion extending from an end of the metal outer tube to prevent the insulation tube and the insulation component from disengaging from the test probe.

8. The test probe of claim 7, wherein the stop portion is C-shaped and radially extends from a circumference of the end of the metal outer tube.

9. The test probe of claim 1, wherein the conductive coil is an elastic helical conductive coil.

10. The test probe of claim 9, wherein an inner radius of the restricting portion is greater than a radius of the tip portion and less than a radius of the retaining portion, such that the tip portion passes through the retaining portion, and the retaining portion abuts against the restricting portion under a pressing force of the resiliently deformed conductive coil, and the conductive coil is further deformed to enable the tip portion to withdraw back into the through hole, in response to the test probe bearing excessive pressure.

11. The test probe of claim 1, wherein the metal inner tube is threaded in an inner surface of the metal inner tube, and the insulation component is externally threaded to screwedly engage with the metal inner tube.

* * * * *

UNITED STATES PATENT AND TRADEMARK OFFICE
CERTIFICATE OF CORRECTION

PATENT NO. : 8,283,939 B2  
APPLICATION NO. : 12/752138  
DATED : October 9, 2012  
INVENTOR(S) : Shen-Chun Li and Shou-Kuo Hsu Page 1 of 1

It is certified that error appears in the above-identified patent and that said Letters Patent is hereby corrected as shown below:

On the Title Page

Please replace Item (30) regarding "Foreign Application Priority Data" with the following:

(30)    Foreign Application Priority Data

Sept. 1, 2009   (CN) .............................200910306443.2

Signed and Sealed this
Twenty-second Day of October, 2013

Teresa Stanek Rea
*Deputy Director of the United States Patent and Trademark Office*